(12) United States Patent
Nishikawa et al.

(10) Patent No.: US 6,971,167 B2
(45) Date of Patent: Dec. 6, 2005

(54) MULTILAYERED CIRCUIT BOARD FORMING METHOD AND MULTILAYERED CIRCUIT BOARD

(75) Inventors: Kazuhiro Nishikawa, Mishima-gun (JP); Norihito Tsukahara, Soraku-gun (JP); Hiroyuki Otani, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 205 days.

(21) Appl. No.: 10/611,868

(22) Filed: Jul. 3, 2003

(65) Prior Publication Data

US 2004/0020047 A1 Feb. 5, 2004

(30) Foreign Application Priority Data

Jul. 5, 2002 (JP) ......................................... 2002-197033
Jun. 30, 2003 (JP) ......................................... 2003-188290

(51) Int. Cl.[7] ................................................. H01K 3/10
(52) U.S. Cl. .............................. 29/852; 29/825; 29/830; 29/846; 156/233; 156/247
(58) Field of Search ........................... 29/825, 830, 846, 29/852; 156/233, 247

(56) References Cited

U.S. PATENT DOCUMENTS

| | | | | |
|---|---|---|---|---|
| 3,324,014 A | * | 6/1967 | Scott ........................... | 205/122 |
| 4,221,047 A | * | 9/1980 | Narken et al. ................ | 29/840 |
| 4,354,895 A | * | 10/1982 | Ellis ............................. | 216/20 |
| 4,606,787 A | * | 8/1986 | Pelligrino .................... | 216/18 |
| 4,789,423 A | * | 12/1988 | Pelligrino .................... | 216/18 |
| 4,830,691 A | * | 5/1989 | Kida et al. .................... | 216/18 |
| 4,915,983 A | * | 4/1990 | Lake et al. ................... | 430/314 |
| 4,927,477 A | * | 5/1990 | Ellis ............................. | 156/182 |
| 5,114,518 A | * | 5/1992 | Hoffarth et al. ............. | 156/212 |
| 5,199,163 A | * | 4/1993 | Ehrenberg et al. ........... | 29/830 |
| 5,592,737 A | * | 1/1997 | Middelman et al. ........ | 29/848 |

FOREIGN PATENT DOCUMENTS

JP         10-335787        12/1998

* cited by examiner

Primary Examiner—Carl J. Arbes
(74) Attorney, Agent, or Firm—Wenderoth, Lind & Ponack, L.L.P.

(57) ABSTRACT

A multilayered circuit board and a method of forming the multilayered circuit board are provided. In a first circuit forming process, a first circuit is formed on an insulating board with a conductor; in a circuit embedding process, the first circuit is embedded in the insulating board so as to have a predetermined surface flatness and a predetermined parallelism; in a masking process, a pilot hole for a via hole is masked at a part of a surface of the circuit; in an insulating layer forming process P5p, an insulating material is applied as a layer to the surface except that portion thereof covered by the mask; in an insulating material layer flattening process, the surface of the insulating material layer is flattened so as to have the predetermined surface flatness and the predetermined parallelism; and in a pilot hole forming process, the mask is removed.

17 Claims, 6 Drawing Sheets

MULTILAYERED CIRCUIT BOARD FORMING METHOD AND MULTILAYERED CIRCUIT BOARD

BACKGROUND OF THE INVENTION

1. Field of the Invention

The present invention relates to a multilayered circuit board formed by layering electric circuits each having electronic components mounted thereon, and a method of forming such a multilayered circuit board.

2. Description of the Background Art

With reference to FIGS. 5, 6, and 7, conventional schemes used for forming a multilayered circuit board are described below. These schemes can be broadly classified in two categories, which are hereinafter referred to as a connective formation scheme and a successive formation scheme.

In the connective formation scheme, a desired number of circuit boards prepared in advance are layered so as to be connected to each other, thereby forming a multilayered circuit board.

In the successive formation scheme, one circuit board is first formed, on which another circuit board is then formed. Repeating this process forms a multilayered circuit board with a desired number of circuit boards integrally layered.

FIGS. 5 and 6 illustrate one example of the above connective formation scheme. In this scheme, an insulating material 7 is laminated with a copper sheet 8, and then the copper sheet 8 is etched for forming electronic circuits. With this, a circuit board having mounted thereon such electronic circuits is formed. Such circuit boards are then connected to each other to form a multilayered circuit board.

FIG. 5 is a cross sectional view of a multilayered circuit board MSc1 configured by connecting (layering) four circuit boards C1, C2, C3, and C4 with each other. Hereinafter, the circuit boards C1, C2, C3, and C4 are collectively referred to as circuit boards C. Each circuit board C is formed by laminating thermoplastic adhesive insulating material 7 with the copper sheet 8, making holes that penetrate through both the insulating material 7 and the copper sheet 8 for forming via holes 4, and further etching the copper sheet 8 to form predetermined electronic circuits.

Holes are made through a process typified by drilling, laser processing, or press work. In general, these holes are made one by one through laser processing or drilling. Then, by using a printing scheme or a quantitative applicator, an inner wall of each hole is filled and applied with a conductive material to form the via holes 4. In this manner, the circuit boards C1, C2, C3, and C4 are respectively prepared.

FIG. 6 illustrates a procedure of placing on the circuit board C1 of a first layer the circuit board C2 of a second layer. For a purpose of layering the circuit board C1 and the circuit board C2 together, presuming that these circuit boards have been finished with high accuracy in dimension as designed, circuits and their components are required to be positioned with high accuracy in terms of a positional relationship defined so as not to interfere with each other.

With these circuit boards C1 and C2 prepared with high dimensional accuracy and being positioned with high positional accuracy, circuit boards are heated and pressured from above and below at a predetermined temperature and pressure, thereby being connected to each other on their surfaces due to thermoplasticity and adhesiveness of the insulating material 7. With such heat and pressure, the copper sheet 8 forming the electronic circuits is embedded in its contacted insulating material 7, as well as being crimped to the via holes 4, thereby ensuring electrical conduction between these layers. Similarly, the circuit board C3 and the circuit board C4 are sequentially connected, thereby forming the multilayered circuit board MSc1.

FIG. 7 illustrates one example of the successive formation scheme. In this scheme, with use of a screen printing scheme, a plurality of circuit boards are successively formed one by one. In FIG. 7, illustrations in cross section show that a circuit board of a first layer has another circuit board formed thereon. In process P1, a cross section of a completed circuit board Ca of the first layer is illustrated. In process P2, circuit board Ca obtained in process P1 is applied thereon with an insulating material 3 for a circuit board Cb (not shown) of a second layer. In process P3, the circuit board Ca obtained in process P2 is further applied with a conductor 2b of the circuit board Cb of the second layer. For convenience in description, circuit boards corresponding to processes P1, P2, and P3 are hereinafter referred to, as required, a circuit board Cc(P1), a circuit board Cc(P2), and a circuit board Cc(P3), respectively.

The circuit board Ca is completed in process P1 as follows. First, a hole is made on an insulating base material 1a, and an inner wall of the hole is supplied or filled with a conductive material to form a via hole 4a. Next, conductor 2a made of the same conductive material is printed through a screen printing scheme in a predetermined pattern on both surfaces of the insulating base material 1a so as to contact the via hole 4a, thereby printing an electronic circuit of the first layer. Then, the conductor 2a is hardened through drying to complete the circuit board Ca. Here, the insulating base material 1a has thereon a conductor-printed portion Pp on which the conductor 2a is printed, and a conductor-unprinted portion Pn on which they are not printed. A difference in height between the conductor-printed portion Pp and the conductor-unprinted portion Pn forms a step Dh, which represents a height from the insulating base material 1a.

The circuit board Cc(P2) is completed in process P2 as follows. The insulating material 3 is screen-printed onto an entire upper surface of the circuit board Cc(P1) except for a predetermined area for forming the via hole 4a on the conductor 2a in a subsequent process (such an area is hereinafter referred to as "via hole forming portion"), thereby forming an insulating layer Li to be contacted with the circuit board Cb (not shown) of the second layer. An upper surface of the insulating layer Li conspicuously reflects irregularities of a surface of the circuit board Cc(P1) located under the insulating layer Li. These irregularities include subtle ones caused by characteristics of the conductor 2a or a mesh of a printing plate, and large ones caused by the conductor-printed portion Pp and the conductor-unprinted portion Pn. Particularly, a portion on the insulating layer Li that corresponds to a set of the conductor-printed portion Pp and the conductor-unprinted portion Pn has a large concave/convex portion 5. The concave/convex portion 5 includes a concave portion 5n corresponding to the conductor-unprinted portion Pn, and a convex portion 5p corresponding to the conductor-printed portion Pp.

The circuit board Cc(P3) is completed in process P3 as follows. In the circuit board Cc(P2) obtained in process P2, after the insulating material 3 is hardened through drying, the inner wall of the above via hole forming portion is supplied or filled with the conductor 2a to form the via hole 4a. Furthermore, the insulating material 3 has thereon the conductor 2b printed for forming electronic circuits of the second layer. Note that the conductor 2b is connected to the conductor 2a of the first layer through the via hole 4a.

A state of attachment of the conductor 2b to the insulating material 3 is varied depending on irregularities of the surface of the insulating layer Li. This is because there is a difference between the concave portions and the convex portions in a distance from the screen printing plate to the insulating material 3 on which the conductor 2b is printed. For this reason, the conductor 2b is printed on the insulating material 3 in a patchy manner. Therefore, an area of the conductor 2b as designed is changed to produce correct-area portions as designed and reduced-area portions 6 (not shown). That is, when the reduced-area portions occur, an effective width of a circuit pattern formed with the conductor 2b partially becomes small. Also, as the area of the conductor 2b is changed, so are electrical characteristics of the electronic circuits. Therefore, such patchy printing extremely degrades an electrical characteristic of electronic circuits as designed.

In order to suppress such degradation, a printing width of the conductor 2b should be set so as to allow for occurrence of such reduced-area portions 6. However, this treatment is not sufficient to eliminate such occurrence, particularly noticeable at the above-stated concave/convex portion 5. Furthermore, the larger the number of layers of circuit boards, the larger the number and size of reduced-area portions 6. For this reason, as the number of layers is increased, it becomes difficult to accurately form electronic circuits. Thus, the number of circuit boards C that can be layered is limited due to the reduced-area portion 6.

One exemplary scheme for forming a circuit board is suggested in Japanese Patent Laid-Open Publication No. 10-335787 (1998-335787). In this scheme, a transfer sheet in which a metal layer is directly adhered to a resin film is placed on an insulating board containing organic resin, and then the resin film is peeled off for transferring the metal layer to the insulating board, thereby forming a wiring circuit on the surface of the insulating board.

In the above-described connective formation scheme, circuit boards to be connected together have to be respectively prepared in advance with high accuracy in terms of dimension. Also, these circuit boards have to be connected together with high accuracy in terms of position so as not to interfere with circuits and components of other circuit boards. Regarding these two types of accuracy, if dimensional and positional deviations are inadequately controlled, these deviations are accumulated as the number of circuit boards to be connected is increased, thereby inconveniently limiting a number of circuit board laminations and, at worst, making it impossible to perform a connecting process itself.

Even with these deviations in accuracy being adequately controlled, the above-mentioned inconveniences occur if a positional relationship among the circuit boards is changed through a heating and pressuring process. In the heating and pressuring process, layered circuit boards are simultaneously heated, causing an insulating material to be softened and deformed. This tends to cause positional deviations among the layers. For this reason, positional accuracy has to be controlled also during the heating and pressuring process. Moreover, a hole-making operation for preparing a via hole takes a lot of time and processes, thereby causing an increase in the number of processes required in this scheme.

In the above-described successive formation scheme, on the other hand, a circuit board formed in advance has printed thereon components of another circuit board and their connecting components. Therefore, the above-mentioned problems in the connective formation scheme, such as high accuracy in terms of position among the circuit board and an increase in the number of processes in order to make a hole for preparing a via hole, do not occur. However, an occurrence of reduced-area portions on a conductor is particularly noticeable at the above-stated concave/convex portion. Furthermore, the larger the number of layers of circuit boards, the larger the number and size of reduced-area portions. For this reason, as the number of layers is increased, it becomes difficult to form electronic circuits as designed. Thus, the number of circuit boards C that can be layered is limited due to the reduced-area portions. Still further, it is difficult to sufficiently eliminate the reduced-area portions caused by printing of the conductor. That is, there is a limit no matter how a printing width of each conductor is set so as to allow for occurrence of such reduced-area portions. Thus, accurate circuit formation is difficult, and also the number of layers has a limit.

In the above connective formation scheme, the conductor is formed in advance according to a predetermined dimension and shape. Therefore, reduced-area portions as occurring in the successive formation scheme do not occur. However, in the connective formation scheme, a plurality of circuit boards are heated and pressured to soften insulating material of the circuit boards, thereby embedding a conductor and also connecting these circuit boards. Therefore, during the connecting process, temperature and pressure applied to the insulating material and the conductor cannot be directly controlled. Consequently, positional and dimensional accuracy of the insulating material and the conductor cannot be controlled either. Yet still, the positional and dimensional accuracy in a multilayered circuit board composed of the insulating material and the conductor cannot be controlled either.

If the above-described scheme for forming a circuit board by using a transfer sheet is applied to the connective formation scheme, dimensional accuracy control can be expected to be improved, but positional accuracy control over a plurality of circuit boards cannot be expected to be improved. Moreover, even if this transfer sheet scheme can be applied to the successive formation scheme, the problems of reduced-area portions cannot be resolved. Therefore, it is not possible to solve various drawbacks caused by the above-mentioned problems that are unique to conventional schemes of forming a multilayered circuit board.

SUMMARY OF THE INVENTION

The purpose of the present invention is to solve the above drawbacks. An object of the present invention is to provide a multilayered circuit board with high accuracy and quality, and a method of forming such a multilayered circuit board. In the multilayered circuit board, dimensional accuracy of circuit boards layered with each other and positional accuracy thereamong can be easily controlled. Also, irregularities of a surface of each circuit board can be solved.

In order to attain the object mentioned above, the present invention is directed to a method of forming a multilayered circuit board, including: a first circuit forming process of forming a first circuit made of a conductor in a predetermined pattern on a first flat surface of a flat insulating board made of an insulating material, the insulating board further having a second flat surface approximately parallel to the first flat surface; a first circuit embedding process of embedding the first circuit in the first insulating board so that the first surface and the first circuit have a predetermined surface flatness, and that the first surface has a predetermined parallelism with respect to the second flat surface; a masking process of forming, on a part of a surface of the embedded first circuit, a mask for forming a pilot hole for a via hole; an insulating layer forming process of forming an insulating material layer by applying insulating material as a layer to the first flat surface having the mask formed thereon, except to the part of the surface on which the mask is located; an insulating material layer flattening process of flattening a surface of the insulating material layer so that the surface of the insulating material layer has the surface flatness and the parallelism with respect to the second flat surface; and a pilot hole forming process of forming the pilot hole by removing the mask from the first circuit with the insulating material layer being flattened.

These and other objects, features, aspects and advantages of the present invention will become more apparent from the following detailed description of the present invention when taken in conjunction with the accompanying drawings.

DESCRIPTION OF THE PREFERRED EMBODIMENTS

Prior to specific descriptions of embodiments of the present invention, a basic concept of the present invention is first described below. The present invention is to prevent occurrence of reduced-area portions in a successive formation scheme using screen printing, as well as to improve the positional and dimensional accuracy of circuit boards to be layered.

In brief, a process in a conventional connective formation scheme for heating and pressuring circuit boards prepared in advance, and embedding a conductor in an insulating material contacted thereto, is further developed and utilized for a subsequent process of applying another conductor of a next circuit board in the successive formation scheme. Unlike the conventional connective formation scheme, the method of the present invention can solve a problem that, due to a heating and pressuring process required for the circuit boards, it is impossible to directly control positional and dimensional accuracy of a conductor and insulating material, thereby in turn making it impossible to directly control such accuracy between the circuit boards, and the conductor and the insulating material. Furthermore, the method of the present invention can directly control heat and pressure conditions set up for the conductor and the insulating material, which can be controlled only indirectly in the connective formation scheme. Therefore, it is possible to ensure not only dimensional accuracy of a multilayered circuit board, but also dimensional and positional accuracy of components on respective layers of the circuit boards forming the multilayered circuit board.

First embodiment

Figure 1:
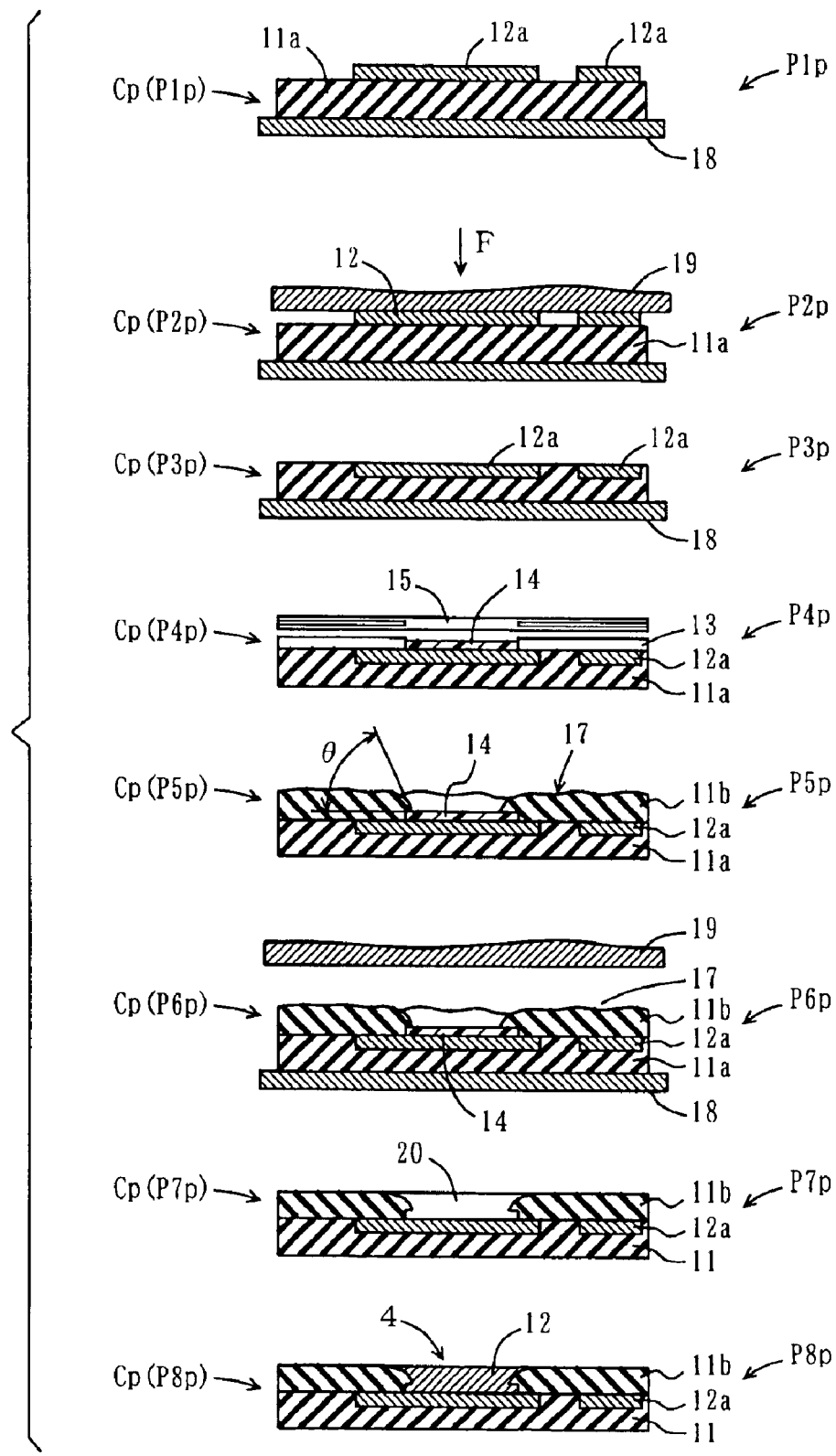
FIG. 1 is an illustration showing a procedure of forming a multilayered circuit board according to a first embodiment of the present invention.

With reference to FIG. 1, a method of forming a multilayered circuit board according to a first embodiment of the present invention is described below. A multilayered circuit board MS1 according to the present invention is formed by using a screen printing scheme as in the above-described conventional successive formation scheme.

FIG. 1 illustrates a procedure of successively forming circuit boards one by one starting from a circuit board of a first layer by using a screen printing scheme, the procedure including processes P1p, P2p, P3p, P4p, P5p, P6p, P7p, and P8p shown stepwise. For convenience in description, circuit boards corresponding to these processes are hereinafter referred to as a circuit board CP(P1p), a circuit board CP(P2p), a circuit board CP(P3p), a circuit board CP(P4p), a circuit board CP(P5p), a circuit board CP(P6p), a circuit board CP(P7p), and a circuit board CP(P8p), respectively.

In process P1p, an insulating board 11a, which forms a circuit board CP of the first layer, is placed on a pad 18 having a predetermined flatness. On the insulating board 11a, a conductor 12a is screen-printed to form electronic circuits, and is then burnt.

In process P2p, with the circuit board CP(P1p) being heated and maintained at a predetermined temperature T to soften the insulating board 11a, a push plate 19 having a predetermined surface flatness S' is pressed at a predetermined pressure F on the conductor 12a for a predetermined time period t so that the push plate 19 has a predetermined parallelism P' with respect to the pad 18. Note that, in FIG. 1, an apparatus for maintaining heat added to the circuit board CP and an apparatus for applying the predetermined pressure on the push plate 19 are not shown for better visibility.

The insulating board 11a can be any as long as it is made of resin having a plastic element and an electrical insulating element. Examples of the insulating board 11a include a film or a sheet of polyester resin, epoxy resin, polyimide resin, and polyolefin resin.

Furthermore, the conductor 12a may be made of electrically-conductive metal, and may be powders or particles of Au, Ag, Cu, Ni, Sn, or Pd, or a mixture thereof. Alternatively, the conductor 12a can be creamy powders or particles having printable viscosity and thixotropy. Such creamy powders or particles can be those of an alloy formed mainly by any of the above-mentioned metals mixed with a resin as an adhesive. Alternatively, such creamy powders or particles can be those each coated with a resin including a plastic element so as to form a micro capsule, and then caused to have adhesiveness at a predetermined temperature or by application of a solvent.

In process P3p, the pressure applied by the push plate 19 is removed, and then the insulating board 11a is cooled. With this, an upper surface of the insulating board 11a becomes flat with the conductor 12a being embedded therein. Consequently, the upper surface of the insulating board 11a having the conductor 12a embedded therein has a predetermined surface flatness S as well as a predetermined parallelism P with respect to a lower surface of the insulating board 11a abutting the pad 18. The surface flatness S' and the parallelism P' of the push plate 19 are selected so that the surface flatness S and the parallelism P of the upper surface of the insulating board 11a having the conductor 12a embedded therein satisfy the following equations (1) and (2):

$$S < 10 \mu m \quad \ldots (1),\text{ and}$$

$$P < 10 \mu m \quad \ldots (2).$$

Furthermore, preferably, S<5μm and P<5μm.

In an exemplary case in which the insulating board 11a made of polyester resin is used, the above-described heating temperature T is 100° C. to 200° C., and the pressure F is $20 \times 10^6$ Pa to $5 \times 10^6$ Pa. The heating temperature T and the pressure F are correlated. By way of example, if the heating temperature T is 100° C., the pressure F is $5 \times 10^6$ Pa. That is, a relationship between the heating temperature T and the pressure F can be expressed by the following equation (3):

$$300 \times 10^6 Pa \leq T \times F \leq 600 \times 10^6 Pa \qquad \ldots (3).$$

Furthermore, more preferably, the heating temperature T and the pressure F are selected so as to satisfy the following equation (4):

$$400 \times 10^6 Pa \leq T \times F \leq 500 \times 10^6 Pa \qquad \ldots (4).$$

In order to heat the circuit board CP(P1a) at the predetermined temperature T, the push plate 19 may be heated as required. Furthermore, the pad 18 may also be heated. Pressuring can be performed after the insulating board 11a has been softened by heating. Alternatively, heating and pressuring may be performed simultaneously.

In process P4p, a predetermined area on the embedded conductor 12a is provided with a mask 14 for forming a via hole 4. The mask 14 is formed by a masking cover 13 having a hole 15 corresponding to a shape and position of the via hole 4 so as to cover an entire upper surface of the insulating board 11a and the conductor 12a. In this case, needless to say, the masking cover 13 covers the upper surface so that an area surrounding the hole 15 is not spaced apart from the conductor 12a.

The masking cover 13 is not restricted to a metal film or a resin film having the hole 15 corresponding to the shape and position of the via hole 4. For example, a resin may be printed to cover the entire upper surface of the circuit board CP(3P) except an area corresponding to the shape and position of the via hole 4. Alternatively, a resin film may be first applied over the entire upper surface of the circuit board CP(3P), and then a portion corresponding to the shape and position of the via hole 4 may be removed by a laser beam.

After forming the mask 14, a coating agent is sprayed by performing plasma coating or heating through the hole 15 of the masking cover 13 onto the conductor 12a. Examples of the coating agent include a fluoride resin, such as 4 fluoride resin or 4-6 fluoride resin, a compound containing such fluoride resin (2-perfluoroalkyl ethanol, 2-bis hexafluoro propane, and the like.), polypropylene resin, polyethylene resin, nylon resin, a sublime compound (naphthalin, for example), and a basic compound (succinic acid, adipic acid, and the like.)

Material of the mask 14 has features of preventing wettability of an acrylate resin, an epoxy resin, or the like forming the insulating layer 11b of the circuit board CPb of the second layer, and increasing a contact angle θ. Furthermore, this material has a feature of distinctively forming a boundary portion of the mask 14 when the insulating layer 11b is printed between the mask 14 and a portion without having the mask 14 being formed.

The mask 14 has to be removed in subsequent process P5p before filling or applying the conductor 12a for forming the via hole 4. The mask 14 can be removed more easily if applied sparingly. Here, an object of the mask 14 is to prevent the wettability of the insulating layer 11b when printed. Therefore, when a fluoride resin or a compound containing a fluoride resin is used as the material of the mask 14, capable of increasing the contact angle θ with respect to the insulating layer 11b made of polyester resin, for example, the above-stated object can be achieved as long as the mask 14 is formed in a shape of a thin film of several or more overlaying molecules of the material of the mask 14. Furthermore, the mask 14 can be formed through plasma coating as well as PVD, CVD, PCVD, spraying, printing, or other schemes. These schemes other than printing require the masking cover 13. The scheme of forming the mask 14 is appropriately selected in consideration of desired characteristics, other processes, cost, and the like. Upon completion of formation of the mask 14, the masking cover 13 is removed, and the procedure then goes to the next process (process P5p).

In process P5p, the mask 14 is formed on the conductor 12a, and then an insulating layer 11b is formed by printing on an entire upper surface of the conductor 12a except the mask 14. The insulating layer 11b is formed so as to contact or slightly overlap the mask 14. Also, the insulating layer 11b is made of acrylate resin or epoxy resin that is creamy with moderate viscosity and thixotropy. The insulating layer 11b formed in the above-described manner has microscopic asperities 17 on its surface, and also has the contact angle θ at the boundary of the mask 14. The microscopic asperities 17 are caused when the insulating layer 11b is peeled off from a printing plate at the time of printing. Such microscopic asperities tend to remain on the surface when the viscosity and thixotropy of the insulating layer are high.

When the insulating layer 11b has high wettability or low viscosity and thixotropy, the contact angle θ is small. Consequently, wet insulating layer 11b spreads over a surface of the mask 14, thereby making it difficult to form the via hole in a predetermined dimension. Therefore, selected as the material of the insulating layer 11b is a resin having the contact angle θ of, ideally, 70 to 90 degrees at the boundary of the mask 14, low wettability, and high viscosity and thixotropy, thereby making it possible to accurately form a shape for the via hole. Also used as the material of the insulating layer 11b can be a resin having plasticity, high adhesiveness with the insulating board 11a and the conductor 12a, and a coefficient of linear expansion equal or similar to that of the insulating board 11a and that of the conductor 12a.

In process P6p, a large number of asperities 17 observed on the surface of the insulating layer 11b formed by printing during the previous process P5p are removed. That is, the surface of the insulating layer 11b is flattened. Flattening during this process is performed in a manner similar to that of the above process P2p or P3p. Since an apparatus to be used and conditions for flattening are the same as those described above, they are not described herein.

However, unlike the above process P2p, heating of the pad 18 may damage insulating board 11 and conductor 12a of electronic circuits, and therefore caution is required. Also, flattening the surface of the insulating layer 11b can be performed by not only heating and pressuring but also machining, such as polishing or grinding. However, such machining may pose problems, such as that cuttings resulting from machining may damage an insulation quality of the circuit and that this machining process requires a longer time to complete flattening, compared with the heating and pressuring process.

In process P7p, in order to form the via hole 4, the mask 14 is removed from the conductor 12a of the first layer. Consequently, a portion of the conductor 12a exposed by this removal and a cylindrical wall of the insulating layer 11b surrounding the exposed portion form a pilot hole 20 of the via hole 4. The mask 14 is removed through chemical etching by using an alkaline etchant or an acid etchant, plasma etching by irradiating an electron beam for splashing the mask, or spattering. Furthermore, if the mask 14 is a sublime compound, a scheme of subliming by heating can also be used for removal. That is, removal of the mask 14 is performed by using a scheme selected as suitable for the material of the mask 14.

In process P8p, the pilot hole 20 is filled or supplied with conductor 12 to form the via hole 4 surrounding the cylindrical inner wall defined by the insulating layer 11b. Needless to say, this via hole 4 is connected to the conductor 12a of the first layer. Repeating the above processes P1p through P8p forms the multilayered circuit board MS having layered therein a desired number of circuit boards.

The order of performing the above processes P5p and P6p is interchangeable. Also, the process of filling the pilot hole 20 of the via hole 4 with the conductor 12 can be performed simultaneously with the process of forming the electronic circuits of the second layer on the surface of the flattened insulating layer 11b. Furthermore, descriptions have been exemplarily made to the successive formation scheme being performed on the upper surface of the insulating board 11a. Needless to say, however, layering can be performed on the lower surface thereof.

Second embodiment

Figure 2:
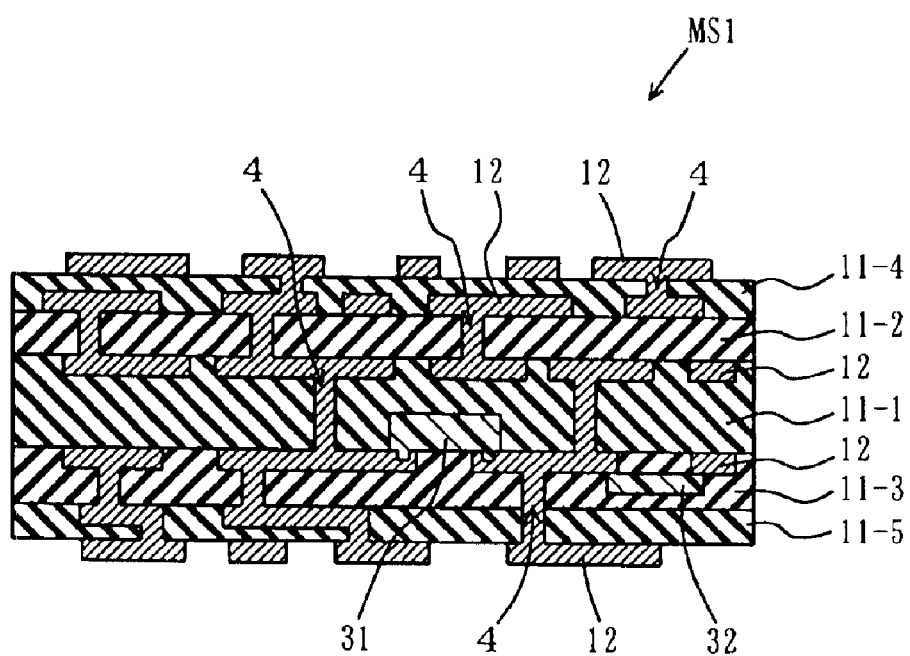
FIG. 2 is a cross sectional view of a multilayered circuit board according to a second embodiment of the present invention.
Figure 3:
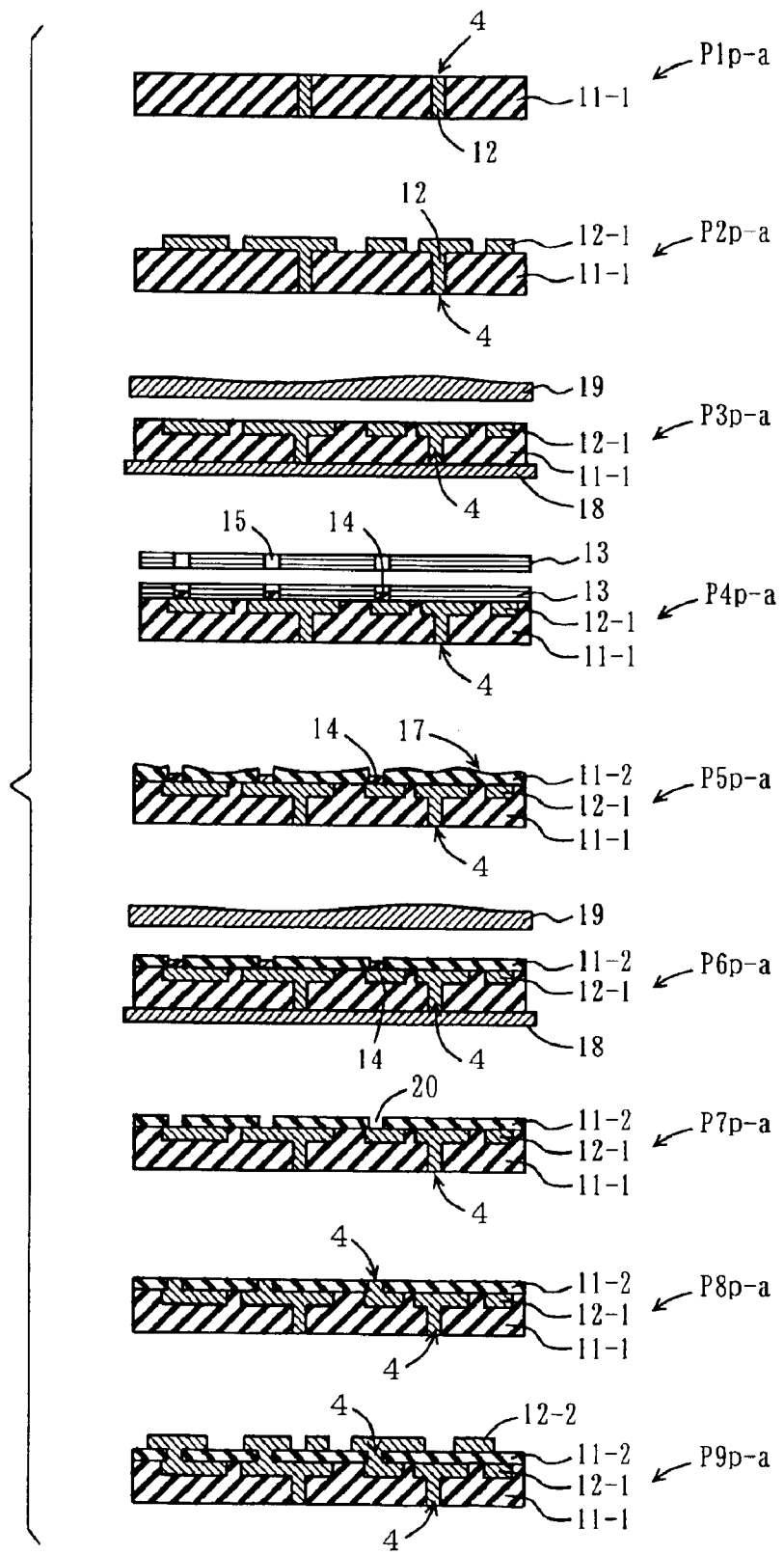
FIG. 3 is an illustration showing a procedure of forming the multilayered circuit board illustrated in FIG. 2.

With reference to FIGS. 2 and 3, a scheme is described below for alternately printing a conductor and an insulating layer on an insulating board to form a multilayered circuit board. FIG. 2 is a cross section of a multilayered circuit board MS2 according to a second embodiment. FIG. 3 schematically illustrates a procedure of forming the multilayered circuit board MS2.

As illustrated in FIG. 2, the multilayered circuit board MS2 is formed by layering five insulating boards 11-1, 11-2, 11-3, 11-4 and 11-5, each having mounted thereon electric circuits. Here, components, a heating and pressuring scheme, and conditions thereof used in the present embodiment are basically the same as those described in the first embodiment, and therefore are not described herein unless otherwise particularly required.

As illustrated in FIG. 3, first prepared in process P1p-1a is the insulating board 11-1 formed of a sheet or a film containing a plastic element, such as a polyester resin, a polyimide resin, or an epoxy resin, and being provided with holes at predetermined locations for connecting upper and lower surfaces thereof. This plastic element is added so that the resin follows a direction of flattening the insulating board 11-1 while being heated. That is, such a plastic resin is selected as having a melting point or a softening point close to heating temperature T for flattening (100° C. to 200° C.). Then, all holes are filled or applied with a conductor 12.

In process P2p-a, electronic circuits of the first layer are formed on a surface of the insulating board 11-1 through screen printing. Also, the electronic circuits are connected to conductor 12 with which the holes are filled or supplied, and are then dried and hardened.

In process P2p-a, conductor 12-1 is heated and pressured at the above-described predetermined temperature T and pressure F. Consequently, a flat surface is obtained with the conductor 12-1 being embedded in the insulating board 11-1.

In process P3p-a, mask 14 is formed at a predetermined location. This process is performed in preparation for via hole 4 for connecting the electronic circuits of the first layer and those of a second layer when electronic circuits of the second layer are formed on the conductor 12-1 of the first layer.

In process P4p-a, the masking cover 13 is removed.

In process P5p-a, an insulating layer 11-2 is printed on an entire surface of the insulating board 11-1 and the conductor 12-1 except an area where the mask 14 is located.

In process P6p-a, microscopic asperities on the surface of the insulating layer 11-2 are flattened.

In process P7p-a, the mask 14 is removed. With this, parts of the conductor 12-1 forming the electronic circuits of the first layer are exposed to form pilot holes 20 of via holes 4.

In process P8p-a, the pilot holes 20 are filled or supplied with the conductor 12-1 to form the via holes 4.

In process P9p-a, a conductor 12-2 is screen-printed on the insulating layer 11-2 flattened in step P6p-a to form the electronic circuits of the second layer. The conductor 12-2 is also connected to the via holes 4 so as to be connected to the conductor 12-1 of the electronic circuits of the first layer.

Repeating the above processes P4p-a through P9p-a can form the multilayered circuit board MS2 having layered therein a desired number of circuit boards.

Third embodiment

Figure 4:
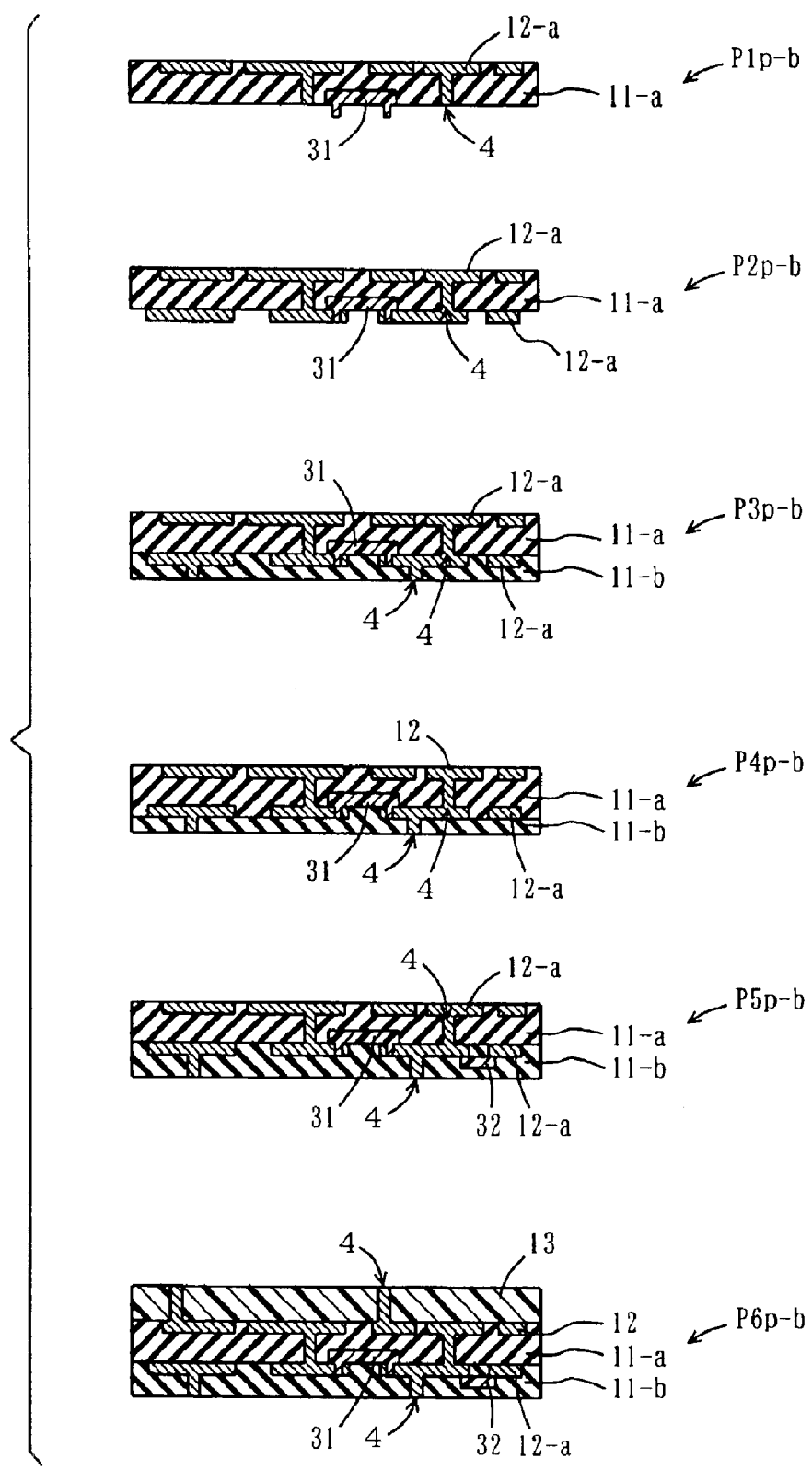
FIG. 4 is an illustration showing a procedure of forming a multilayered circuit board according to a third embodiment of the present invention.
Figure 5:
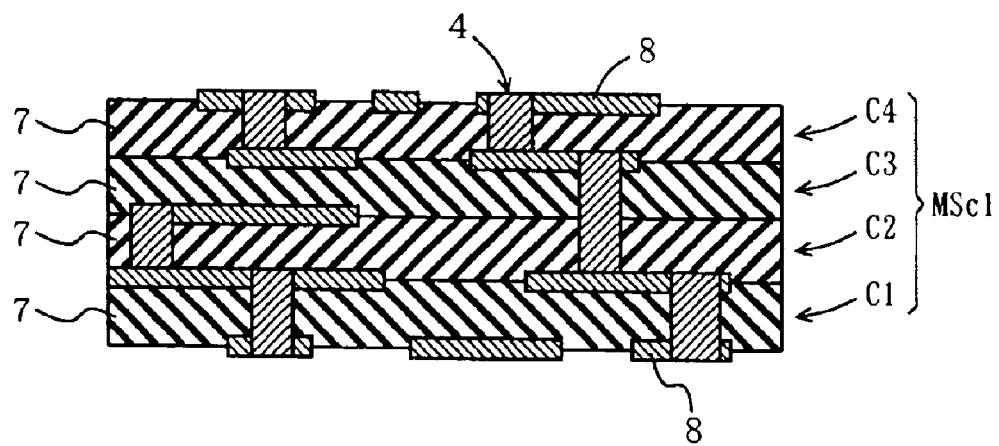
FIG. 5 is a cross sectional view of a conventional multilayered circuit board.
Figure 6:
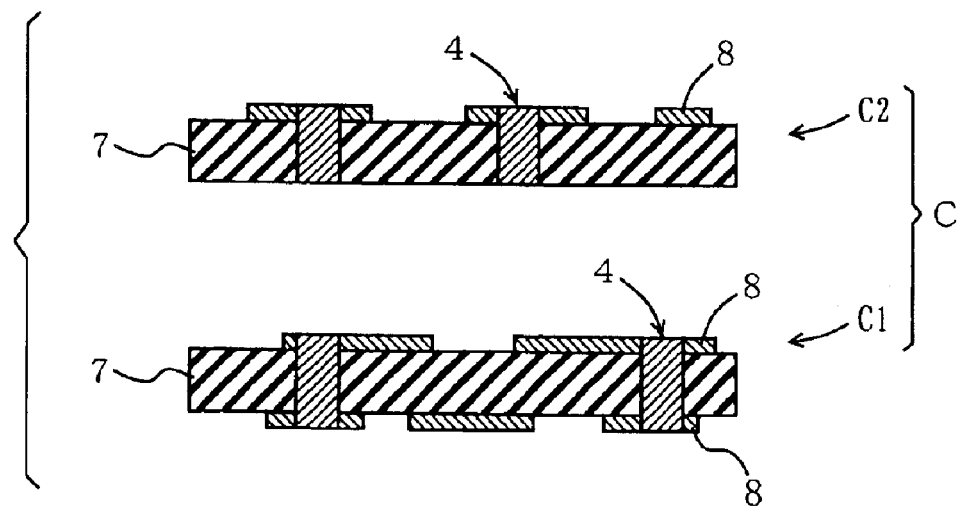
FIG. 6 is an illustration showing a procedure of forming the multilayered circuit board illustrated in FIG. 5.
Figure 7:
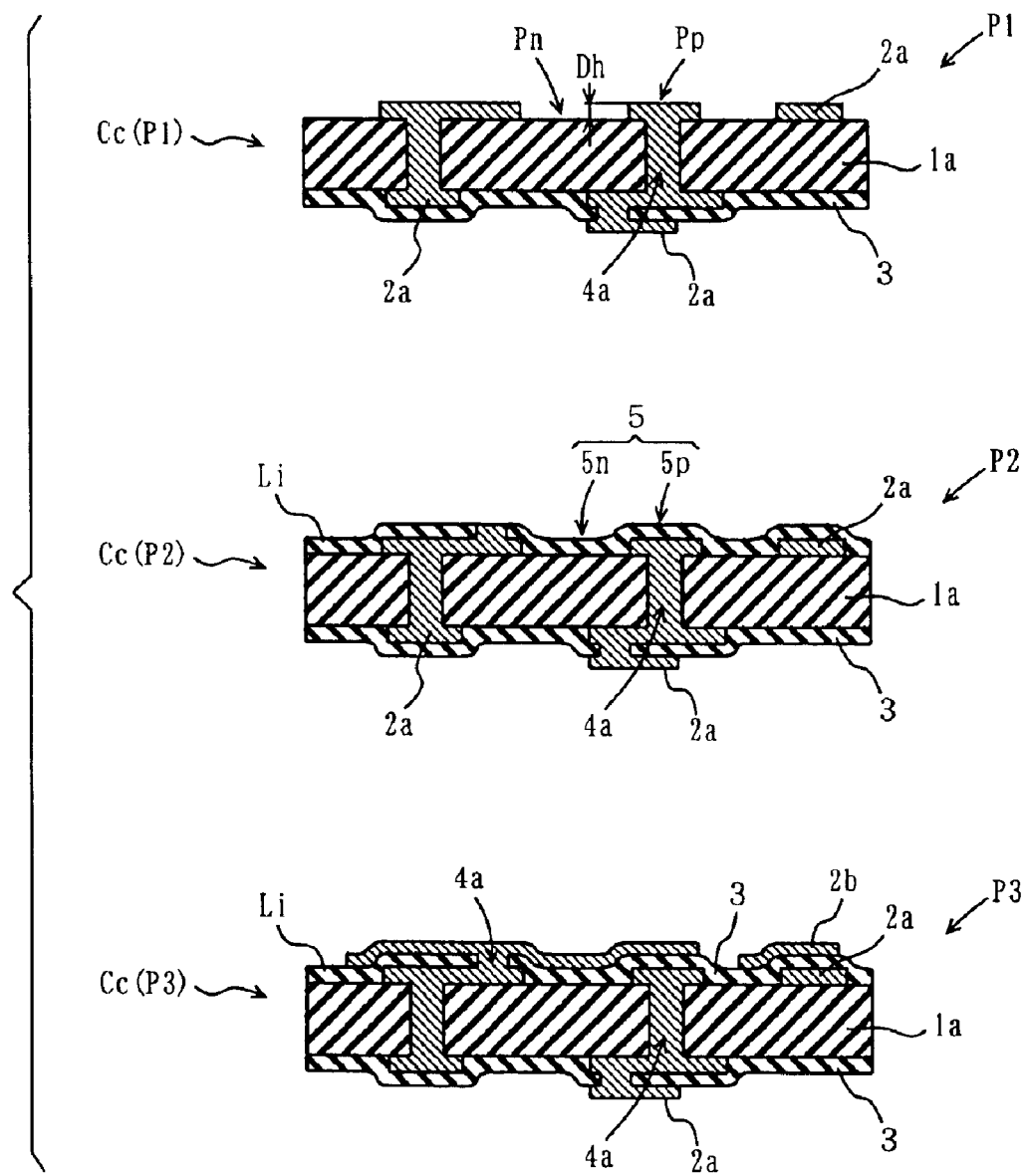
FIG. 7 is an illustration showing a procedure of forming another conventional multilayered circuit board.

With reference to FIG. 4, a scheme is described below for forming a multilayered circuit board incorporated with a component, such as a semiconductor, a resistor, a capacitor, and a coil. FIG. 4 schematically illustrates a procedure of forming a multilayered circuit board MS3 according to a third embodiment. Here, components, a heating and pressuring scheme, and conditions thereof used in the present embodiment are basically the same as those described in the first and second embodiments, and therefore are not described herein unless otherwise particularly required.

In process P1p-b, an insulating board 11-a formed by the scheme according to the first or second embodiment, and embedded with conductor 12a for forming electronic circuits are provided together with a semiconductor device 31 having bumps 32 formed at an electrode portion. The semiconductor device 31 is placed at a predetermined location on the insulating board 11-a so that a side where the bumps 32 of the semiconductor device 31 are located is taken as a main surface of the insulating board 11-a. The insulating board 11-a containing a plastic element and the semiconductor device 31 are then heated at predetermined temperature T in accordance with their heating profiles, thereby softening the insulating board 11-a.

In process P2p-b, the semiconductor device 31, while being heated, is press-fit and embedded in the heated and softened insulating board 11-a. For press-fitting, it is important to confirm that the insulating board 11-a has been softened, and then to press the semiconductor device 31 without tilting it. After embedment of the semiconductor device, a surface on which the bumps 32 of the semiconductor device 31 are located and a surface of the insulating board 11-a are made to be co-planer. Also, the bumps 32 have a shape protruding from the surface of the insulating board 11-a. At this time, as required, the insulating board 11-a is partially removed through, for example, grinding or etching, until the bumps 32 are exposed. After embedment of the semiconductor device 31, the insulating board is cooled and hardened.

In process P3p-b, electronic circuits are formed on a main surface (lower surface in FIG. 4) of the insulating board 11-a by printing the conductor 12-a. At this time, the conductor 12-a is also printed on the bumps 32, and the semiconductor device 31 is connected to electronic circuits as one of their components. Then, the conductor 12-a forming the electronic circuits is dried and hardened.

In process P4p-b, the mask is formed in the same manner as described in the first or second embodiment for forming the via holes 4. Then, an insulating layer 11-b is formed by printing. Then, microscopic asperities on a surface of the insulating layer 11-b are flattened by heating and pressuring.

In process P5p-b, after the mask is removed, each pilot hole 20 is filled or supplied with the conductor 12-a to form via hole 4. By embedding in the insulating board 11-b the conductor 12-a of the electronic circuits connected to the semiconductor device 31, the semiconductor device 31 is further pushed into the insulating board 11-b.

In process P6p-b, another insulating layer 11-b and via hole 4 are formed on the insulating board 11-a flattened with the conductor 12-a being embedded. The scheme in this process requires more thickness of the insulating board 11-a and more operations, compared with process P3p-b. However, states of the upper and lower surfaces of the insulating board 11-a become close to each other. This is advantageous regarding bow and deformation. Whether to use the scheme in process P1p-b or the scheme in process P6p-b is appropriately decided in consideration of cost, characteristics, and quality.

To incorporate another component 32 in addition to the semiconductor device 31, the mask for forming the via hole 4 is first formed at a predetermined location on the conductor 12 of the electronic circuits by using the scheme according to the first or second embodiment. Then, an electrode of the component 32 is placed during process P6p-b by using the conductor 12 or another conductor as an electrical connecting material, or by soldering, for example. Then, connection, resistive paste, or dielectric paste is printed for forming a resistor, a capacitor, a thin film, and a film component. Then, after the insulating layer 11-b is formed by printing so as to cover the component 32, the insulating layer 11-b is flattened, the mask is removed, and the pilot hole 20 is filled with the conductor 12-a. The semiconductor device 31 and the component 32 can be incorporated in either the insulating board 11-a or the insulating layer 11-b.

As described in the foregoing, in the present invention, all components including a circuit board of a first layer are successively formed in the order in which they are layered. Therefore, unlike the connective formation scheme, it is not required to prepare in advance circuit boards to be connected to each other with high dimensional accuracy, or to ensure positional accuracy that would be required at a time of connecting these circuit boards.

Furthermore, desired surface flatness and parallelism are ensured in each layer. Therefore, it is possible to prevent occurrence of reduced-area portions where a circuit pattern is partially narrowed, which is a problem in the conventional successive formation scheme. The present invention enables a process of printing a conductor on a flattened insulating layer with high accuracy, thereby forming a reliable multilayered circuit board with high accuracy.

Still further, it is possible to achieve a multilayered circuit board capable of incorporating in each layer a component, such as a semiconductor device, a resistor, a capacitor, and a coil, with high accuracy.

Still further, it is possible to more accurately form a via hole connecting a plurality of layers through a printing scheme.

While the invention has been described in detail, the foregoing description is in all aspects illustrative and not restrictive. It is understood that numerous other modifications and variations can be devised without departing from the scope of the invention.

What is claimed is:

1. A method of forming a multilayered circuit board, comprising:

a first circuit forming process of forming a first circuit made of a conductor in a predetermined pattern on a first flat surface of a flat insulating board made of an insulating material, said insulating board further having a second flat surface approximately parallel to said first flat surface;

a first circuit embedding process of embedding said first circuit in said first insulating board so that said first surface and said first circuit have a predetermined surface flatness, and so that said first surface has a predetermined parallelism with respect to said second flat surface;

a masking process of forming, on a part of a surface of the embedded first circuit, a mask for forming a pilot hole for a via hole;

an insulating layer forming process of forming an insulating material layer by applying insulating material as a layer onto said first flat surface and embedded first circuit except for a part thereof on which said mask is located;

an insulating material layer flattening process of flattening a surface of said insulating material layer so that said surface of the insulating material layer has the surface flatness and the parallelism with respect to said second flat surface; and a pilot hole forming process of forming the pilot hole by removing said mask from said first circuit with said insulating material layer having been flattened.

2. The method of forming the multilayered circuit board according to claim 1, wherein $S<5\mu m$, and $P<5\mu m$, wherein S is the surface flatness and P is the parallelism.

3. The method of forming the multilayered circuit board according to claim 1, wherein said first circuit embedding process includes:
  a process of heating and maintaining said insulating material of said insulating board, and said first circuit, at a predetermined temperature T; and
  a process of pressuring the heated and maintained insulating material and first circuit at a predetermined pressure F toward said second flat surface to achieve the surface flatness and the parallelism, wherein $100° C. \leq T \leq 200° C.$, $2 \times 10^6 Pa \leq F \leq 5 \times 10^6 Pa$, and $300 \times 10^6 Pa \leq T \times F \leq 600 \times 10^6 Pa$.

4. The method of forming the multilayered circuit board according to claim 1, further comprising:

a via hole forming process of forming the via hole by filling said pilot hole with a conductor;

a second circuit forming process of forming a second circuit by applying a conductor to a surface of the flattened insulating material layer in a predetermined pattern; and a second circuit embedding process for embedding said second circuit in said flattened insulating material layer so that a surface of said flattened insulating material layer and said second circuit have the surface flatness, and so that said surface of said flattened insulating material layer has the parallelism with respect to said second flat surface.

5. The method of forming the multilayered circuit board according to claim 4, further comprising
a circuit board multilayering process of successively forming a predetermined number of circuit boards by repeating said second circuit forming process and said second circuit embedding process a predetermined number of times.

6. The method of forming the multilayered circuit board according to claim 1, wherein
said insulating material of said insulating board contains a plastic component.

7. The method of forming the multilayered circuit board according to claim 1, wherein
said conductor is selected from a group including Au, Ag, Cu, Ni, Sn, and Pd.

8. The method of forming the multilayered circuit board according to claim 1, wherein
said conductor is selected from a group including an Au compound, an Ag compound, a Cu compound, an Ni compound, an Sn compound, and a Pd compound.

9. The method of forming the multilayered circuit board according to claim 1, wherein
said conductor is selected from a group including an alloy mainly containing any of Au, Ag, Cu, Ni, Sn, and Pd.

10. The method of forming the multilayered circuit board according to claim 1, wherein
said conductor is a mixture of an alloy mainly containing any of Au, Ag, Cu, Ni, Sn, and Pd, and an organic compound.

11. The method of forming the multilayered circuit board according to claim 1, wherein
said mask is of a material selected from a group including a compound containing fluorine, a monad, a resin, a polyethylene resin, a polypropylene resin, a vinyl chloride resin, a nylon resin, a sublime compound, and a basic acid compound.

12. The method of forming the multilayered circuit board according to claim 1, wherein
said mask is formed through any of plasma coating, PVD, CVD, PCVD, spraying, and printing.

13. The method of forming the multilayered circuit board according to claim 1, wherein
said mask is removed through a scheme selected from a group including plasma etching, spattering, chemical etching, and heating.

14. The method of forming the multilayered circuit board according to claim 1, wherein
said first circuit forming process comprises forming a first circuit that includes a component.

15. The method of forming the multilayered circuit board according to claim 4, wherein
said second circuit forming process comprises forming a second circuit that includes a component.

16. The method of forming the multilayered circuit board according to claim 6, wherein
said insulating material of said insulating layer contains a plastic component.

17. The method of forming the multilayered circuit board according to claim 1, wherein
said insulating material of said insulating layer contains a plastic component.

* * * * *